(12) United States Patent
Mackay et al.

(10) Patent No.: US 11,463,008 B2
(45) Date of Patent: Oct. 4, 2022

(54) DECREASING OUTPUT DROOP IN A POWER CONVERTER VIA AN ENERGY STORAGE CAPACITOR

(71) Applicant: Cirrus Logic International Semiconductor Ltd., Edinburgh (GB)

(72) Inventors: Graeme G. Mackay, Austin, TX (US); Eric J. King, Austin, TX (US); Ajit Sharma, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/080,030

(22) Filed: Oct. 26, 2020

(65) Prior Publication Data
US 2021/0159798 A1 May 27, 2021

Related U.S. Application Data

(60) Provisional application No. 62/939,062, filed on Nov. 22, 2019.

(51) Int. Cl.
*H02M 3/158* (2006.01)
*G01R 19/165* (2006.01)
(Continued)

(52) U.S. Cl.
CPC .... *H02M 3/1584* (2013.01); *G01R 19/16538* (2013.01); *H02M 1/0003* (2021.05); *H02M 3/1566* (2021.05)

(58) Field of Classification Search
None
See application file for complete search history.

(56) References Cited

U.S. PATENT DOCUMENTS 5,757,167 A 5/1998 Arora et al.
6,597,158 B2 * 7/2003 Umeda ............... H02M 3/07
323/268
(Continued)

FOREIGN PATENT DOCUMENTS

EP 2775599 A1 9/2014
EP 3214746 A1 9/2017
(Continued)

OTHER PUBLICATIONS

International Search Report and Written Opinion of the International Searching Authority, International Application No. PCT/US2020/047237, dated Oct. 30, 2020.
(Continued)

*Primary Examiner* — Jeffrey A Gblende
(74) *Attorney, Agent, or Firm* — Jackson Walker L.L.P.

(57) ABSTRACT

A system may include a power converter configured to convert a source voltage from a power source to an output voltage at an output capacitor at an output of the power converter, a dual-mode power converter electrically coupled to the power converter, the dual-mode power converter having a plurality of switches and a power inductor, an energy storage element electrically coupled to the dual-mode power converter, and control circuity configured to, when the output voltage is below a threshold voltage magnitude, control the plurality of switches to operate the dual-mode power converter as a buck converter in order to transfer energy from the energy storage element to the output capacitor via an electrical current through the power inductor.

22 Claims, 4 Drawing Sheets

(51) Int. Cl.
*H02M 1/00* (2006.01)
*H02M 3/156* (2006.01)

(56) References Cited

U.S. PATENT DOCUMENTS

| | | | | |
|---|---|---|---|---|
| 7,190,150 | B2* | 3/2007 | Chen | H02M 3/157 |
| | | | | 323/222 |
| 9,088,247 | B2* | 7/2015 | Arno | H03F 1/0227 |
| 9,577,587 | B2* | 2/2017 | Maru | H03F 1/0277 |
| 9,639,102 | B2 | 5/2017 | Dally | |
| 10,263,523 | B1 | 4/2019 | Sonntag et al. | |
| 10,476,392 | B1 | 11/2019 | Matsuura et al. | |
| 10,720,835 | B2 | 7/2020 | King et al. | |
| 10,734,885 | B2 | 8/2020 | King et al. | |
| 2005/0264268 | A1 | 12/2005 | Ueno | |
| 2008/0129219 | A1 | 6/2008 | Smith et al. | |
| 2008/0259647 | A1 | 10/2008 | Risseeuw | |
| 2008/0278136 | A1 | 11/2008 | Murtojarvi | |
| 2010/0019702 | A1 | 1/2010 | Jang et al. | |
| 2010/0156175 | A1 | 6/2010 | Wei | |
| 2011/0075446 | A1* | 3/2011 | Doutreloigne | H02M 3/33592 |
| | | | | 363/15 |
| 2012/0205974 | A1 | 8/2012 | McCaslin et al. | |
| 2012/0268094 | A1 | 10/2012 | Scaldaferr et al. | |
| 2013/0249505 | A1 | 9/2013 | Brown et al. | |
| 2014/0197814 | A1 | 7/2014 | Shi et al. | |
| 2015/0222235 | A1 | 8/2015 | Swanson et al. | |
| 2017/0005647 | A1 | 1/2017 | Pan et al. | |
| 2018/0287496 | A1* | 10/2018 | Bayer | H02M 3/1582 |
| 2019/0181754 | A1 | 6/2019 | Ash et al. | |
| 2019/0245444 | A1 | 8/2019 | Kimura | |
| 2021/0083578 | A1 | 3/2021 | King et al. | |

FOREIGN PATENT DOCUMENTS

| | | |
|---|---|---|
| EP | 3240171 A1 | 11/2017 |
| GB | 2555902 A | 5/2018 |
| WO | 2019135820 A1 | 7/2019 |

OTHER PUBLICATIONS

Stala, Robert et al., "A Switched-Capacitor DC-DC Converter with Variable Number of Voltage Gains and Fault-Tolerant Operation", IEEE Transactions on Industrial Electronics, IEEE Service Center, Piscataway, NJ, US, vol. 66, No. 5, May 1, 2019.

Stmicroelectronics NV, AN4218—Hardware design guideline power supply and voltage measurement—Application Note, Doc ID 024014 Rev 3, 26 pages, Oct. 2015.

Freescale Semiconductor, Inc., Multimedia Applications Division, i.MX233 Power Management Unit and Battery Charger—Application Note, Document No. AN3883, Rev. 0, 36 pages, Jul. 2009.

Texas Instruments, TPS6128x Low-, Wide-Voltage Battery Front-End DC/DC Converter Single-Cell Li-Ion, Ni-Rich, Si-Anode Applications—Data sheet, SLVSBI1A, 57 pages, Oct. 2013, Revised Sep. 2014.

Texas Instruments, Designing Robust TPS65217 Systems for VIN Brownout—Application Report, 13 pages, Oct. 2017.

Renesas Electronics Corporation, Preventing Subsystem Brownouts in Mobile Devices—White Paper, 6 pages.

MFJ Enterprises, Inc., MFJ—Super Battery Booster—Model MFJ-4416C—Instruction Manual, Version OA, 16 pages, 2017.

International Search Report and Written Opinion of the International Searching Authority, International Application No. PCT/US2020/056782, dated Mar. 4, 2021.

Van Vroonhoven, Caspar, A 0-to-60V-Input Vcm Coulomb Counter with Signal-Dependent Supply Current and ±0.5% Gain Inaccuracy from -50° C. to 125° C., 2020 IEEE International Solid-State Circuits Conference, Feb. 19, 2020.

International Search Report and Written Opinion of the International Searching Authority, International Application No. PCT/US2021/029631, dated Jul. 23, 2021.

Qiu et al., "Digital Average Current-Mode Control of PWM DC-DC Converts without Current Sensors", IEEE Transactions on Industrial Electronics, IEEE Service Center, vol. 57, No. 5, May 10, 2010, Piscataway, NJ, USA.

International Search Report and Written Opinion of the International Searching Authority, International Application No. PCT/US2021/029584, dated Jul. 30, 2021.

International Search Report and Written Opinion of the International Searching Authority, International Application No. PCT/US2021/032474, dated Aug. 3, 2021.

Vinnikov et al., "Solar Optiverter—A Novel Hybrid Approach to the PHotovoltaic Module Level Power Electronics", IEEE Transactions on Industrial Electronics, IEEE Service Center, vol. 66, No. 5, May 1, 2019, pp. 3869-3880, Piscataway, NJ, USA.

International Search Report and Written Opinion of the International Searching Authority, International Application No. PCT/US2021/032496, dated Aug. 4, 2021.

International Search Report and Written Opinion of the International Searching Authority, International Application No. PCT/US2021/030932, dated Aug. 20, 2021.

International Search Report and Written Opinion of the International Searching Authority, International Application No. PCT/US2021/039356, dated Oct. 1, 2021.

* cited by examiner

DECREASING OUTPUT DROOP IN A POWER CONVERTER VIA AN ENERGY STORAGE CAPACITOR

RELATED APPLICATION

The present disclosure claims priority to U.S. Provisional Patent Application Ser. No. 62/939,062, filed Nov. 22, 2019, which is incorporated by reference herein in its entirety.

FIELD OF DISCLOSURE

The present disclosure relates in general to circuits for electronic devices, including without limitation personal audio devices such as wireless telephones and media players, and more specifically, to limited average current in a peak-controlled boost converter.

BACKGROUND

Portable electronic devices, including wireless telephones, such as mobile/cellular telephones, cordless telephones, mp3 players, and other consumer audio devices, are in widespread use. In the context of an audio application, such portable electronic devices may include circuitry for driving a pair of headphones or one or more speakers. Such circuitry often includes a speaker driver including a power amplifier for driving an audio output signal to headphones or speakers. Oftentimes, a power converter may be used to provide a supply voltage to a power amplifier in order to amplify a signal driven to speakers, headphones, or other transducers. In addition, a power converter may be used to deliver electrical energy to any other suitable load.

A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier.

Often, boost converters operate as peak current-controlled boost converters, wherein a main control loop of a control system is used to determine a peak current requirement on each switching phase of the boost converter in order to generate a desired boosted output voltage of the boost converter. Present in many boost converter control systems is protection circuitry to ensure that the current of a boost converter is maintained below a maximum value. The detection of the peak current in accordance with the main control loop and detection of the maximum allowable current is often performed by two separate circuits: a first comparator comparing a measured current (e.g., measured current of a power inductor of the boost converter) with a target peak current signal and a second comparator comparing the measured current to the maximum current limit. The main control loop, which may also be known as a compensator, may generate a target peak current signal, and such target peak current signal may be compared by the first comparator to the measured current in order to perform peak-current control of a boost converter.

In many instances, it may be desirable to limit electrical current drawn by a boost converter or other power converter due to non-ideal effects such as direct-current (DC) loss, switching losses, non-overlap time, and/or other effects. Circuitry may be added to eliminate these errors, as is known in the art. When operating with current-limited behavior, some power converters may exhibit undesirable effects, such as a loss of output voltage regulation, droop of output voltage, etc. Accordingly, approaches are desired for reducing or eliminating such undesirable effects.

SUMMARY

In accordance with the teachings of the present disclosure, one or more disadvantages and problems associated with existing approaches to operating a power converter may be reduced or eliminated.

In accordance with embodiments of the present disclosure, a system may include a power converter configured to convert a source voltage from a power source to an output voltage at an output capacitor at an output of the power converter, a dual-mode power converter electrically coupled to the power converter, the dual-mode power converter having a plurality of switches and a power inductor, an energy storage element electrically coupled to the dual-mode power converter, and control circuitry configured to, when the output voltage is below a threshold voltage magnitude, control the plurality of switches to operate the dual-mode power converter as a buck converter in order to transfer energy from the energy storage element to the output capacitor via an electrical current through the power inductor.

In accordance with these and other embodiments of the present disclosure, a method may be provided for use in a system comprising a power converter configured to convert a source voltage from a power source to an output voltage at an output capacitor at an output of the power converter. The method may comprise, when the output voltage is below a threshold voltage magnitude, controlling a plurality of switches of a dual-mode power converter electrically coupled to the power converter and comprising the plurality of switches and a power inductor to operate the dual-mode power converter as a buck converter in order to transfer energy from an energy storage element to the output capacitor via an electrical current through the power inductor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
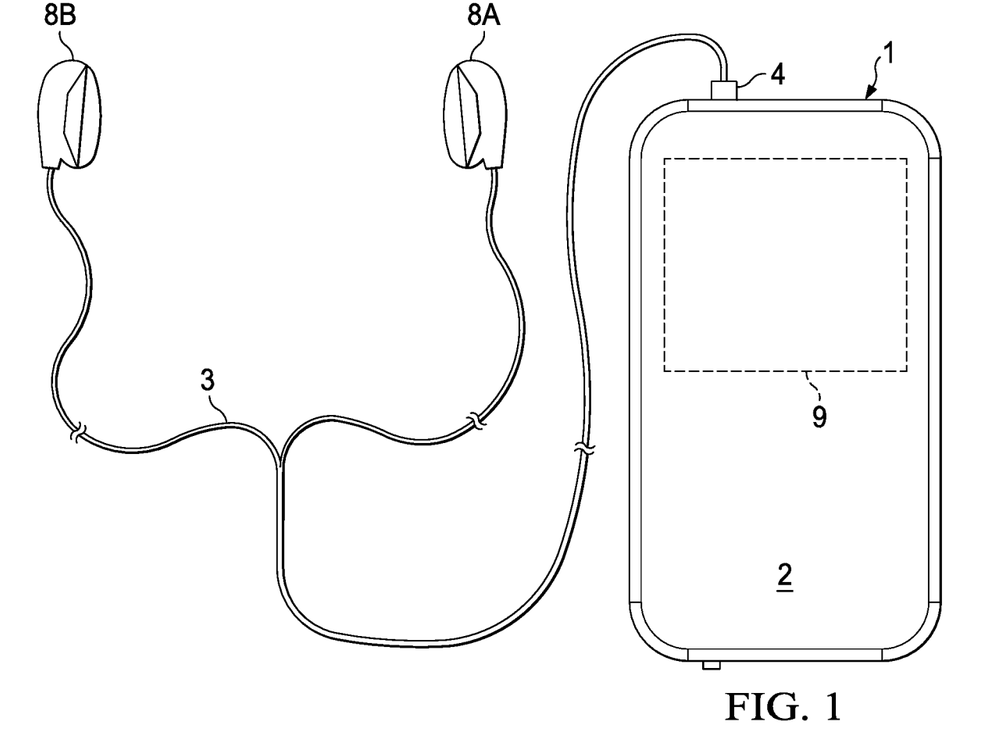
FIG. 1 illustrates an example portable electronic device, in accordance with embodiments of the present disclosure.

FIG. 1 illustrates an example portable electronic device 1, in accordance with embodiments of the present disclosure. FIG. 1 depicts portable electronic device 1 coupled to a headset 3 in the form of a pair of earbud speakers 8A and 8B. Headset 3 depicted in FIG. 1 is merely an example, and it is understood that portable electronic device 1 may be used in connection with a variety of audio transducers, including without limitation, headphones, earbuds, in-ear earphones, and external speakers. A plug 4 may provide for connection of headset 3 to an electrical terminal of portable electronic device 1. Portable electronic device 1 may provide a display to a user and receive user input using a touch screen 2, or alternatively, a standard liquid crystal display (LCD) may be combined with various buttons, sliders, and/or dials disposed on the face and/or sides of portable electronic device 1.

Figure 2:
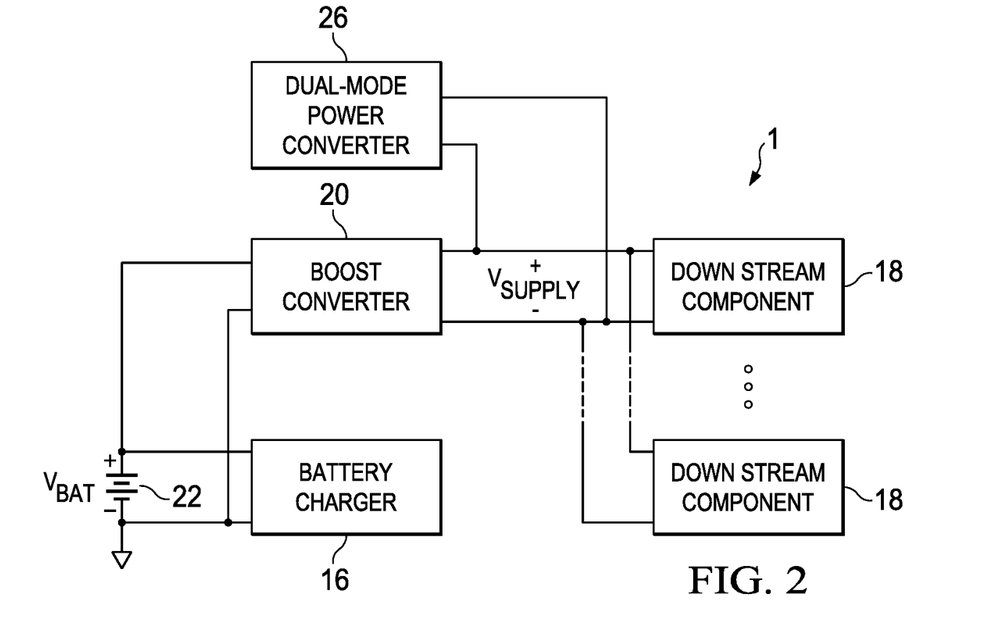
FIG. 2 illustrates a block diagram of selected components internal to a portable electronic device, in accordance with embodiments of the present disclosure.

FIG. 2 illustrates a block diagram of selected components integral to mobile device 1, in accordance with embodiments of the present disclosure. As shown in FIG. 2, portable electronic device 1 may include a boost converter 20 configured to boost a battery voltage $V_{BAT}$ to generate a supply voltage $V_{SUPPLY}$ to a plurality of downstream components 18 of portable electronic device 1. Downstream components 18 of portable electronic device 1 may include any suitable functional circuits or devices of portable electronic device 1, including without limitation processors, audio coder/decoders, amplifiers, display devices, etc. As shown in FIG. 2, portable electronic device 1 may also include a battery charger 16 for recharging battery 22.

Also as shown in FIG. 2, portable electronic device 1 may include a dual-mode power converter 26 coupled to the output of boost converter 20 and configured to implement an energy storage capacitor to minimize droop on supply voltage $V_{SUPPLY}$ (e.g., due to transient effects or current-limited operation of boost converter 20) as described in greater detail below.

In some embodiments of portable electronic device 1, boost converter 20 and battery charger 16 may comprise the only components of portable electronic device 1 electrically coupled to battery 22, and boost converter 20 may electrically interface between battery 22 and all downstream components of portable electronic device 1. However, in other embodiments of portable electronic device 1, some downstream components 18 may electrically couple directly to battery 22.

Figure 3:
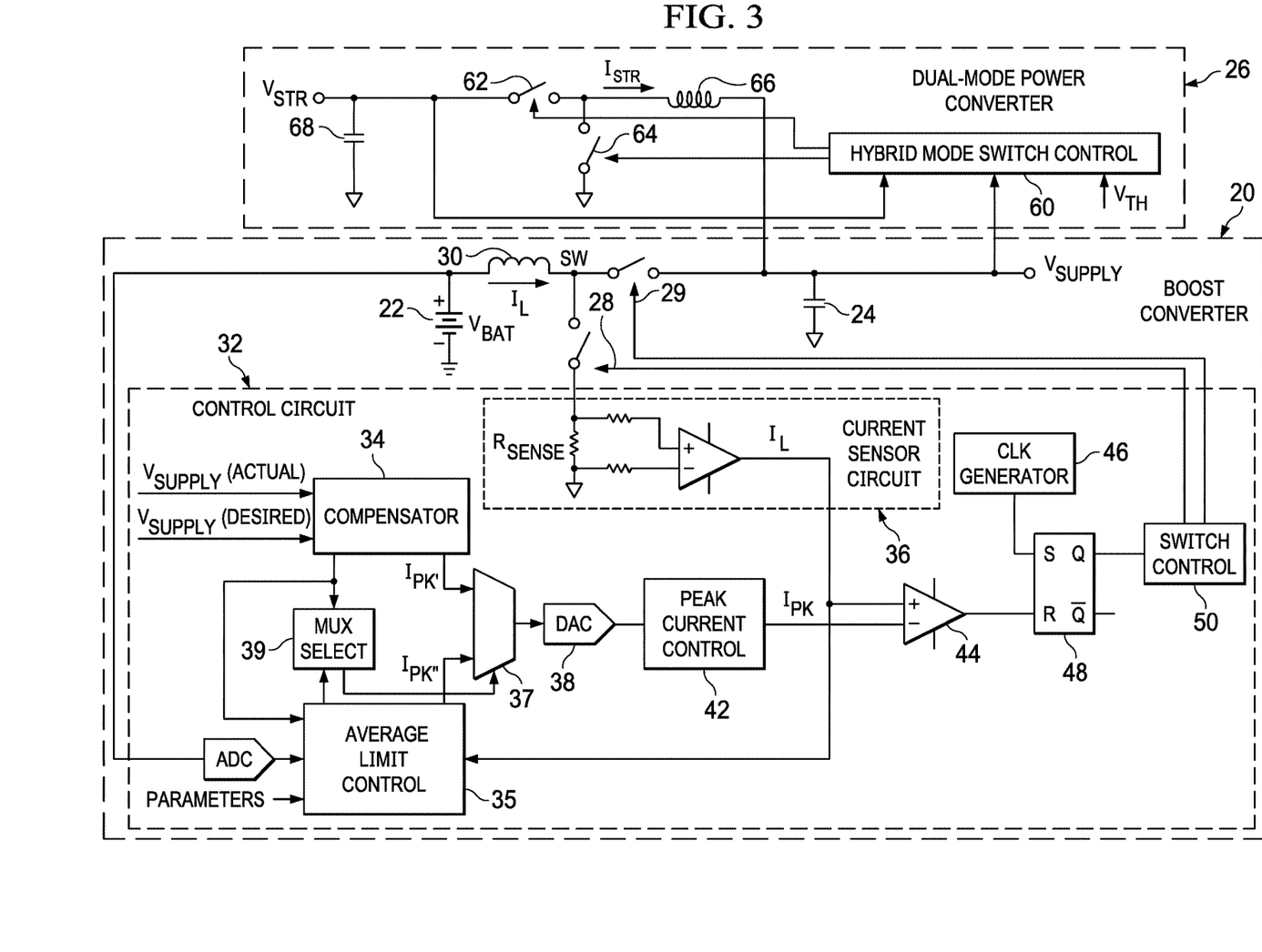
FIG. 3 illustrates a block diagram of selected components of an example peak-current control boost converter with average current limit control in combination with a dual-mode power converter, in accordance with embodiments of the present disclosure.

FIG. 3 illustrates a block diagram of selected components of a peak-current control boost converter 20 with average current limit control in combination with dual-mode power converter 26, in accordance with embodiments of the present disclosure.

Boost converter 20 may include a battery 22, a power inductor 30, a switch 28, a switch 29, and a control circuit 32. Control circuit 32 may include a compensator 34, current average limit control block 35, a multiplexer 37, a current sensor circuit 36, a digital-to-analog converter (DAC) 38, a peak current control subcircuit 42, a peak current comparator 44, a clock (CLK) generator 46, a latch 48, and switch control block 50.

In operation in both CCM and DCM, the duty cycle of switch 28 may determine the magnitude of supply voltage $V_{SUPPLY}$ relative to battery voltage $V_{BAT}$. For example, in CCM, the duty cycle D needed to provide a desired supply voltage $V_{SUPPLY}$ may be given by $D=1-V_{BAT}/V_{SUPPLY}$. Thus, for a desired level of supply voltage $V_{SUPPLY}$ (e.g., which may be based on an envelope of an output signal of an amplifier), control circuit 32 may implement a feedback control loop, which may be internal to compensator 34, based on measured supply voltage $V_{SUPPLY}$ and measured inductor current $I_L$, which may be measured by current sensor circuit 36 (e.g., using a sense resistor with resistance $R_{SENSE}$; in some embodiments, $R_{SENSE}$ may have a resistance of approximately 10 mΩ). Thus, control circuit 32 may monitor actual supply voltage $V_{SUPPLY}$, compare it against a desired supply voltage $V_{SUPPLY}$, and increase or decrease actual supply voltage $V_{SUPPLY}$ by increasing or decreasing the peak of inductor current $I_L$. In that vein, compensator 34 may generate a digital signal indicative of a desired peak current, and DAC 38 may, when multiplexer 37 is selected to output the output of compensator 34, convert such digital signal into an analog equivalent peak current signal $I_{PK}'$.

In addition, current average limit control block 35 may generate a digital signal indicative of a target average current limit $I_{AVG\_LIM}$ representative of a maximum average current to flow through power inductor 30. Such target average current signal $I_{AVG\_LIM}$ may be set based on a maximum current limit of power inductor 30, which may be among the parameters received by average limit control block 35. Other parameters received by average limit control block 35 may include battery voltage $V_{BAT}$ and/or a parameter programmed to be indicative of maximum current as a function of battery voltage $V_{BAT}$. Additional or alternative parameters may include supply voltage $V_{SUPPLY}$, digital audio input signal DIG_IN, and/or analog signal $V_{IN}$.

Average limit control block 35 may also generate its own version of peak current $I_{PK}''$ (which may be different than that generated by compensator 34) based on a target average current signal determined by average limit control subcircuit 35. As shown in FIG. 3, multiplexer 37 may select one of the peak current signals generated by compensator 34 and average limit control block 35 based on a control signal communicated from multiplexer select block 39.

Multiplexer select block 39 may be configured such that, if the peak current determined by compensator 34 is less than the peak current determined by average limit control block 35, multiplexer select block 39 may cause multiplexer 37 to select the peak current determined by compensator 34. On the other hand, if the peak current determined by compensator 34 is greater than the peak current determined by average limit control block 35, then multiplexer select block 39 may cause multiplexer 37 to select the peak current determined by average limit control block 35.

Together, the output of comparator 44, clock generator 46, and latch 48 may be arranged as shown, or arranged in another suitable manner, to generate a control signal to switch control block 50. For example, clock generator 46 may generate a clock signal indicating the beginning of a switching cycle and comparator 44 may, based on a point in which measured inductor current $I_L$ reaches peak current $I_{PK}$, generate a signal indicating the end of a first phase of the switching cycle. Based on such signals indicating timing of switch cycles and switch phases of boost converter 20, latch 48 may generate appropriate control signal(s) to switch control block 50, which may in turn generate appropriate control signals to switches 28 and 29 to selectively activate and deactivate switches 28 and 29.

Dual-mode power converter 26 may include a storage capacitor 68, a power inductor 66, a switch 62, a switch 64, and a hybrid mode switch control circuit 60. As its name suggests, dual-mode power converter 26 may operate in one of at least two modes.

When supply voltage $V_{SUPPLY}$ is above a threshold voltage $V_{TH}$, dual-mode power converter 26 may operate in a first mode, in which hybrid mode switch control circuit 60 may cause dual-mode power converter 26 to operate as a boost converter to boost supply voltage $V_{SUPPLY}$ onto storage capacitor 68 to generate a storage voltage $V_{STR}$ significantly higher (e.g., more than a de minimis amount caused by tolerances or noise) in voltage magnitude than that of supply voltage $V_{SUPPLY}$. Accordingly, during the first mode, dual-mode power converter 26 may effectively store excess energy generated by boost converter 20 onto storage capacitor 68.

On the other hand, when supply voltage $V_{SUPPLY}$ falls below threshold voltage $V_{TH}$, as may happen when supply voltage $V_{SUPPLY}$ droops due to current-limited operation of boost converter 20 and/or bandwidth-limited operation of boost converter 20, dual-mode power converter 26 may operate in a second mode, in which hybrid mode switch control circuit 60 may cause dual-mode power converter 26 to operate as a buck converter to transfer energy stored on storage capacitor 68 to boost capacitor 24. Accordingly, during the second mode, dual-mode power converter 26 may effectively transfer energy stored within storage capacitor 68 onto supply voltage $V_{SUPPLY}$ in order to reduce or eliminate voltage droop.

In some instances, dual-mode power converter 26 may operate in a third or inactive mode, in which hybrid mode switch control circuit 60 causes switches 62 and 64 to remain open, such that storage voltage $V_{STR}$ remains generally constant. The third mode may occur when storage voltage $V_{STR}$ is at or above a desired target voltage magnitude for storage voltage $V_{STR}$.

Figure 4:
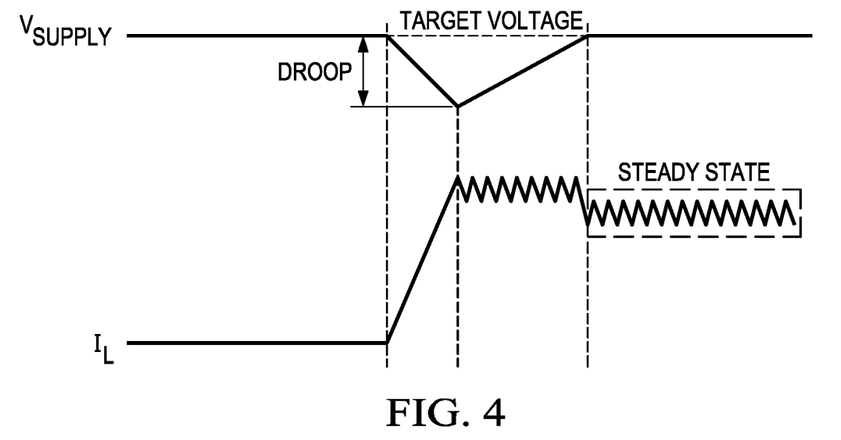
FIG. 4 illustrates graphs depicting example waveforms for selected voltages within the example hybrid peak-current control boost converter shown in FIG. 3, in accordance with embodiments of the present disclosure.
Figure 5:
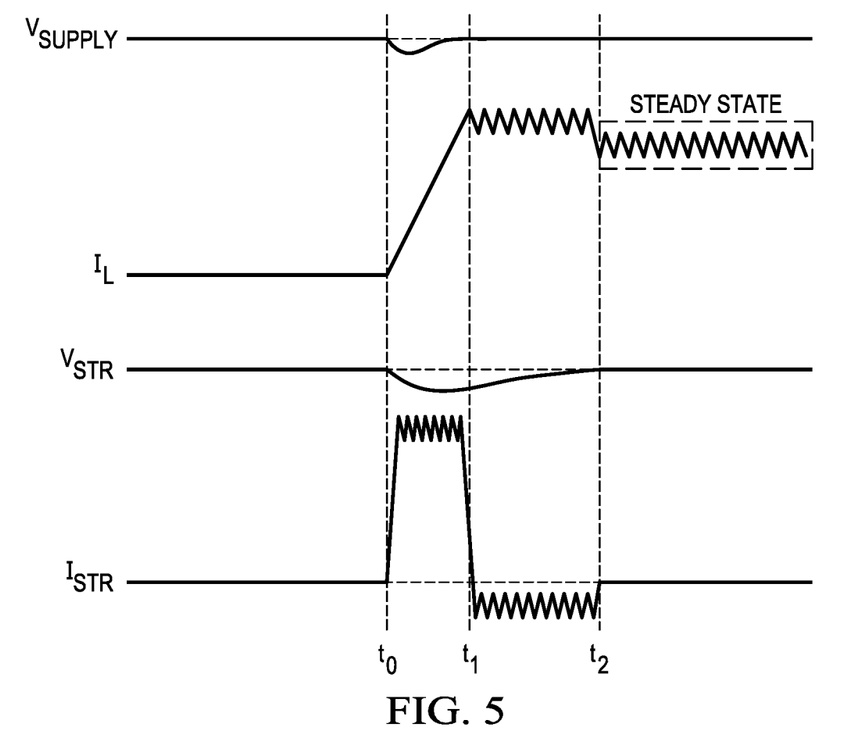
FIG. 5 illustrates example waveforms that show operation of a dual-mode power converter, in accordance with embodiments of the present disclosure.
Figure 6:
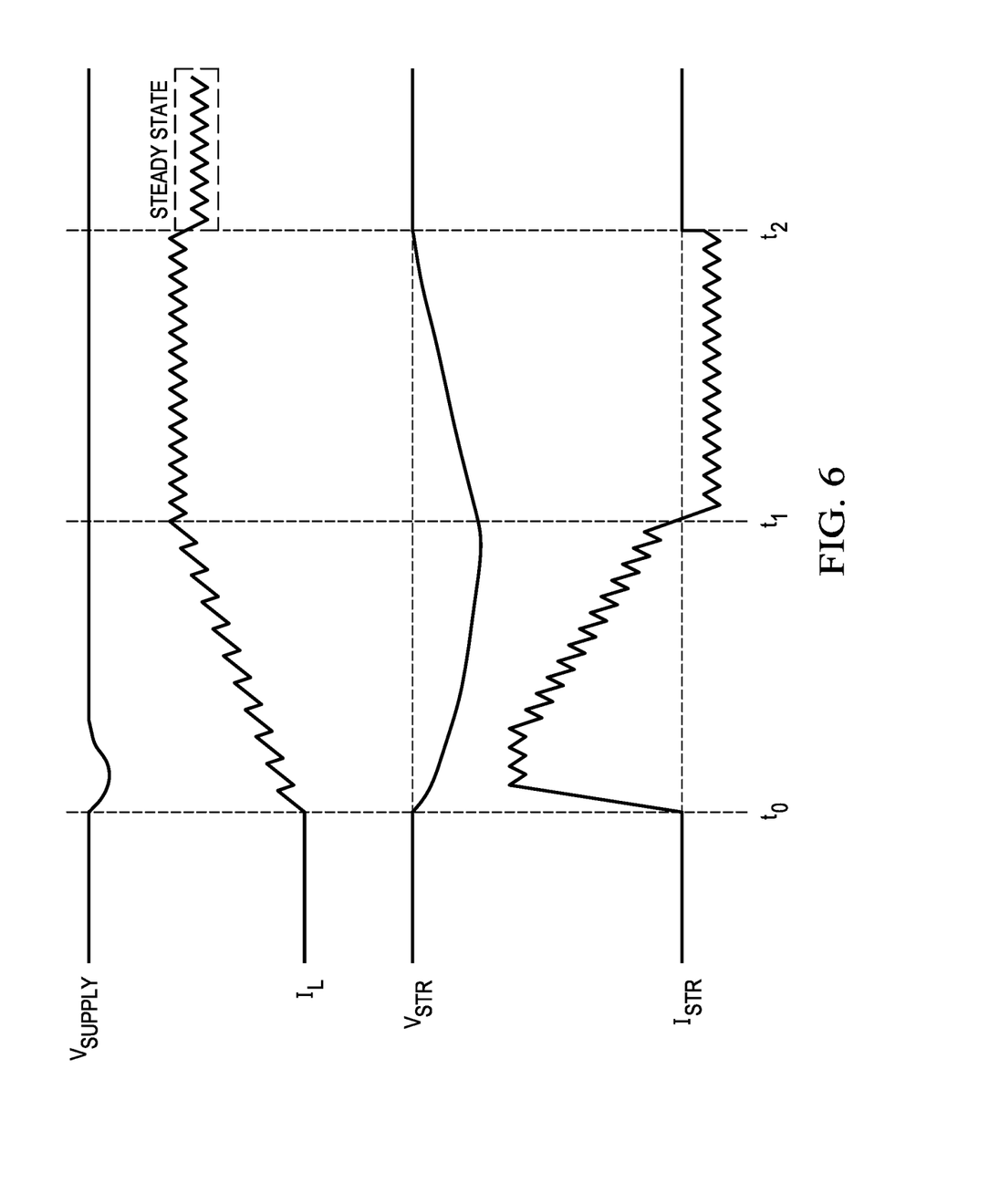
FIG. 6 illustrates example waveforms that show alternative operation of a dual-mode power converter, in accordance with embodiments of the present disclosure.

To further illustrate the functionality of dual-mode power converter 26, reference is made to FIGS. 4 through 6.

FIG. 4 illustrates a droop that may occur on supply voltage $V_{SUPPLY}$ in the absence of dual-mode power converter 26 from dual-mode power supply 10. As shown in FIG. 4, such droop on supply voltage $V_{SUPPLY}$ below its target voltage level may occur because inductor current $I_L$ is not at or above its final steady state current. Such droop may occur because the output load of boost converter 20 may be unpredictable, and transients may occur outside of an operational bandwidth of boost converter 20. This droop could possibly be minimized by using a high-capacitance capacitor to implement boost capacitor 24. However, cost constraints and circuit area constraints may make use of large capacitances unfeasible for use in portable electronic devices.

FIG. 5 illustrates example operation of dual-mode power converter 26, in accordance with the present disclosure. As shown in FIG. 5, upon detection of droop in supply voltage $V_{SUPPLY}$ at time $t_0$, hybrid mode switch control 60 may control switching of switches 62 and 64 to cause dual-mode power converter 26 to operate in the second mode as a buck mode power converter to transfer charge, in the form of a positive current $I_{STR}$, from storage capacitor 68 to boost capacitor 24. At a time $t_1$, supply voltage $V_{SUPPLY}$ may return to its target voltage magnitude (e.g., threshold voltage $V_T$), at which point hybrid mode switch control 60 may control switching of switches 62 and 64 to cause dual-mode power converter 26 to operate in the first mode as a boost mode power converter to transfer charge from boost capacitor 24 to storage capacitor 68, in the form of a negative current $I_{STR}$, to replenish voltage $V_{STR}$ to its target voltage magnitude. At time $t_2$, once voltage $V_{STR}$ returns to its target voltage magnitude, hybrid mode switch control 60 may disable switching of switches 62 and 64 to cause dual-mode power converter 26 to operate in the third (inactive) mode.

FIG. 6 illustrates example alternative operation of dual-mode power converter 26, in accordance with the present disclosure. As shown in FIG. 6, upon detection of droop in supply voltage $V_{SUPPLY}$ at time $t_0$, hybrid mode switch control 60 may control switching of switches 62 and 64 to cause dual-mode power converter 26 to operate in the second mode as a buck mode power converter to transfer charge, in the form of a positive current $I_{STR}$, from storage capacitor 68 to boost capacitor 24. However, to control inrush current from battery 22, control circuit 32 may control switches 28 and 29 to gradually (rather than almost instantaneously) increase power inductor current $I_L$ during the period of the second mode. Further, during the second mode, hybrid mode switch control 60 may control switching of switches 62 and 64 to gradually (rather than almost instantaneously) decrease current $I_{STR}$ during a transient period of the second mode, in order to reduce or eliminate overshoot of supply voltage $V_{SUPPLY}$. At a time $t_1$, supply voltage $V_{SUPPLY}$ may return to its target voltage magnitude (e.g., threshold voltage $V_T$), at which point hybrid mode switch control 60 may control switching of switches 62 and 64 to cause dual-mode power converter 26 to operate in the first mode as a boost mode power converter to transfer charge from boost capacitor 24 to storage capacitor 68, in the form of a negative current $I_{STR}$, to replenish voltage $V_{STR}$ to its target voltage magnitude. At time $t_2$, once voltage $V_{STR}$ returns to its target voltage magnitude, hybrid mode switch control 60 may disable switching of switches 62 and 64 to cause dual-mode power converter 26 to operate in the third (inactive) mode.

Although the description above in reference to FIGS. 5 and 6 contemplate minimizing droop in response to transient behavior associated with boost converter 20, it is understood that methods and system described herein could also be used to eliminate output droop resulting from current-limiting behavior of boost converter 20, as described with reference to FIG. 3.

Although the foregoing contemplates using a dual-mode power converter 26 to minimize droop in a boost converter 20, it is understood that methods and system described herein could also be used to eliminate output droop in other power converters, including without limitation buck converters and/or buck-boost converters.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a power converter configured to convert a source voltage from a power source to an output voltage at an output capacitor at an output of the power converter;
   a dual-mode power converter electrically coupled to the power converter, the dual-mode power converter having a plurality of switches and a power inductor;
   an energy storage element electrically coupled to the dual-mode power converter; and
   control circuitry configured to, when the output voltage is below a threshold voltage magnitude, control the plurality of switches to operate the dual-mode power converter as a buck converter in order to transfer energy from the energy storage element to the output capacitor via an electrical current through the power inductor.

2. The system of claim 1, wherein a storage voltage on the energy storage element is significantly higher than the threshold voltage when energy transfer occurs from the energy storage element to the output capacitor.

3. The system of claim 1, wherein the control circuitry is further configured to, when the output voltage is above a threshold voltage magnitude, control the plurality of switches to operate the dual-mode power converter in order to transfer energy from the output capacitor to the energy storage element via the electrical current through the power inductor.

4. The system of claim 3, wherein the control circuitry is further configured to, when the output voltage is above a threshold voltage magnitude, control the plurality of switches to operate the dual-mode power converter as a boost converter in order to transfer energy from the output capacitor to the energy storage element via the electrical current through the power inductor.

5. The system of claim 1, wherein the control circuitry is configured to, during a period of time when energy is transferred from the energy storage element to the output capacitor, gradually increase a magnitude of a second electrical current associated with the power converter to compensate the output voltage while the power converter is limiting current from the power source.

6. The system of claim 1, wherein the control circuitry is further configured to, when the output voltage is above a second threshold voltage magnitude greater than the first threshold magnitude, disable switching of the plurality of switches to operate the dual-mode power converter in an inactive mode.

7. The system of claim 1, wherein the power source is a battery.

8. The system of claim 1, wherein the energy storage element is a capacitor.

9. The system of claim 1, wherein the output voltage acts as a power supply voltage to another electric or electronic component.

10. The system of claim 1, wherein the output voltage acts as a power supply voltage to a signal amplifier.

11. The system of claim 1, wherein the dual-mode power converter is interfaced between the output capacitor and the energy storage element.

12. A method comprising, in a system comprising a power converter configured to convert a source voltage from a power source to an output voltage at an output capacitor at an output of the power converter:
   when the output voltage is below a threshold voltage magnitude, controlling a plurality of switches of a dual-mode power converter electrically coupled to the power converter and comprising the plurality of switches and a power inductor to operate the dual-mode power converter as a buck converter in order to transfer energy from an energy storage element to the output capacitor via an electrical current through the power inductor.

13. The method of claim 12, wherein a storage voltage on the energy storage element is significantly higher than the threshold voltage when energy transfer occurs from the energy storage element to the output capacitor.

14. The method of claim 12, further comprising, when the output voltage is above a threshold voltage magnitude, controlling the plurality of switches to operate the dual-mode power converter in order to transfer energy from the output capacitor to the energy storage element via the electrical current through the power inductor.

15. The method of claim 14, further comprising, when the output voltage is above a threshold voltage magnitude, controlling the plurality of switches to operate the dual-mode power converter as a boost converter in order to transfer energy from the output capacitor to the energy storage element via the electrical current through the power inductor.

16. The method of claim 12, further comprising, during a period of time when energy is transferred from the energy storage element to the output capacitor, gradually increasing a magnitude of a second electrical current associated with the power converter to compensate the output voltage while the power converter is limiting current from the power source.

17. The method of claim 12, further comprising, when the output voltage is above a second threshold voltage magnitude greater than the first threshold magnitude, disabling switching of the plurality of switches to operate the dual-mode power converter in an inactive mode.

18. The method of claim 12, wherein the power source is a battery.

19. The method of claim 12, wherein the energy storage element is a capacitor.

20. The method of claim 12, wherein the output voltage acts as a power supply voltage to another electric or electronic component.

21. The method of claim 12, wherein the output voltage acts as a power supply voltage to a signal amplifier.

22. The method of claim 12, wherein the dual-mode power converter is interfaced between the output capacitor and the energy storage element.

* * * * *